United States Patent [19]
Watanabe

[11] Patent Number: 5,948,595
[45] Date of Patent: Sep. 7, 1999

[54] METHOD FOR PRODUCING A PRESENSITIZED PRINTING PLATE

[75] Inventor: Shinya Watanabe, Hino, Japan

[73] Assignee: Konica Corporation, Tokyo, Japan

[21] Appl. No.: 08/986,017

[22] Filed: Dec. 5, 1997

[30]   Foreign Application Priority Data

Dec. 11, 1996   [JP]   Japan ................................. 8-330900

[51] Int. Cl.$^6$ ................................................. G03F 7/115
[52] U.S. Cl. ..................... 430/273.1; 430/950; 430/302
[58] Field of Search ............................... 430/273.1, 950, 430/302

[56]   References Cited

U.S. PATENT DOCUMENTS

| | | | |
|---|---|---|---|
| 5,006,442 | 4/1991 | Cooper et al. | 430/273.1 |
| 5,162,193 | 11/1992 | Murray et al. | 430/273.1 |
| 5,576,137 | 11/1996 | Frass et al. | 430/950 |

FOREIGN PATENT DOCUMENTS 57-34558   2/1982   Japan .

*Primary Examiner*—Janet Baxter
*Assistant Examiner*—Sin J. Lee
*Attorney, Agent, or Firm*—Frishauf, Holtz, Goodman, Langer & Chick, P.C.

[57]   ABSTRACT

A method for producing a presensitized printing plate is disclosed. The method comprises the steps of providing a photosensitive layer on a support spraying a resin dissolved or dispersed in an organic solvent on the surface of the photosensitive layer so that sprayed droplets of the resin solution or dispersion are stuck onto the surface of the photosensitive layer to form dots of the resin, and drying the droplets stuck on the surface of the photosensitive layer so that the surface of the photosensitive layer is dotted with the particles of the resin.

7 Claims, No Drawings

METHOD FOR PRODUCING A PRESENSITIZED PRINTING PLATE

FIELD OF THE INVENTION

This invention relates to a method for producing a presensitized printing plate, particularly relates to a method for making fine irregularities on the surface of photosensitive layer of a presensitized printing plate to shorten a time necessary to make sufficient contact with a film in a vacuum contacting print process.

BACKGROUND OF THE INVENTION

In the preparation process of a printing plate using a presensitized printing plate, a method, so-called a vacuum contact method, is usually used to print an original image formed on a film to the presensitized printing plate. By this method, the film having the original image and the presensitized printing plate are placed and contacted between a glass plate and a rubber sheet of a vacuum printer. The photosensitive surface of the presensitized printing plate to be used for the vacuum printing method is subjected to a matting treatment so that all area of the plate is sufficiently contacted in a shortened time.

The method described in JP O.P.I. 57-34558 has been known as a method for matting the surface of the presensitized printing plate. According to this method, an aqueous liquid in which a resin is dissolved or dispersed, is sprayed onto the surface of the photosensitive layer of the plate and dried to stick on the surface for matting the surface. By such the method, is raised a problem that the adhesion of the matting agent to the photosensitive layer is insufficient and the matting agent is easily come off from the surface. Furthermore, when a water-soluble resin is used, matting particles of the resin are collapsed under a high humid condition and the vacuum-contacting ability is degraded.

SUMMARY OF THE INVENTION

The object of the invention is to solve the problem in the usual technology, and to provide a method capable of producing a presensitized planographic printing plate having a high vacuum-contacting ability, on which particles of matting agent particles are stuck with a sufficient strength.

The above-mentioned object of the invention can be attained by a method for producing a presensitized printing plate comprising the steps of providing a photosensitive layer on a support spraying a resin dissolved or dispersed in an organic solvent on the surface of the photosensitive layer so that sprayed droplets of the resin solution or dispersion are stuck onto the surface of the photosensitive layer to form dots of the resin, and drying the droplets stuck on the surface of the photosensitive layer so that the surface of the photosensitive layer is dotted with the particles of the resin.

DETAILED DESCRIPTION OF THE INVENTION

In the invention, the presensitized printing plate is basically composed of a support and a photosensitive layer which is provided on the support. The photosensitive layer is changed in the solubility to developer when the layer is exposed to light. The presensitized plate is usually used for preparation of a planographic printing plate.

The above-mentioned support includes a plate-shaped material having a high dimension stability. As such the support, a grained aluminum support is preferably usable. As the method for graining the surface, a mechanical graining method, an electro-chemical graining method, a chemical graining method by etching the surface by an alkali or an acid or mixture thereof and a combination of these methods may be applied. As a preferred support, an aluminum plate is usable which is grained by etching by brushing and/or electrolysis, anodized and hydrophilized. The grained aluminum support is subjected to an anodizing and sealing treatments according to necessity. A hydrophilic layer may be provided on the aluminum support. Moreover, a protective layer can be provided on the back surface of the support for preventing the dissolution of aluminum into a developer and the formation of scratch on the photosensitive layer when the presensitized printing plate is stacked with each other. As to the detail of the support, British Patent Publication 2,030,309A can be referred.

A photosensitive layer usually used in a presensitized printing plate is usable in the invention. The usable photosensitive layer includes, for example, a positive type photosensitive layer containing an o-quinonediazide compound as the photosensitive component, a negative type photosensitive layer containing a photosensitive diazonium salt or a photosensitive azide compound as the photosensitive component, and a negative type photosensitive layer containing a photopolymerizable compound having an ethylenic unsaturated double bond or a photo-crosslinkable compound having cinnamic acid or a dimethylmaleimido group as the photosensitive component. These photosensitive layers each contains the photosensitive component and a binder resin as the principal components thereof.

As the photosensitive component of the above-mentioned positive type photosensitive layer, a resin which is produced by condensation and polymerization of a phenol having one or more hydroxyl groups such as phenol, cresol and/or pyrogallol with an active carbonyl compound such as formalin or acetone and esterized by o-naphthoquinonediazidesulfonic acid is preferably exemplified. As the binder resin, a resin formed by condensation polymerization of cresol and/or phenol with formalin, so-called novolak resin, is preferably usable.

These photosensitive layers have been known. As to the detail of the photosensitive layer, British Patent Publication 2,030,309A can be referred.

In the invention, a resin dissolved or dispersed in an organic solvent is sprayed preferably by a spray gun onto the surface of the photosensitive layer. The solution or dispersion of the resin is atomized by the spray gun to form droplet. The droplets are flown from the spray gun to the surface of the photosensitive layer and stuck thereon to form dots of the resin. Then the droplets stuck on the surface of the photosensitive layer are dried to be strongly fixed on the surface. In the invention, it is necessary that the resin droplets are stuck on the surface of the photosensitive layer so as to form dots of the resin droplets. It is to be avoided that the resin solution or dispersion sprayed on the surface of the photosensitive layer forms a continuous layer since matted surface hardly be formed in such the case.

It is preferred for sticking the dots of the resin droplets on the surface of the photosensitive layer that conditions for spraying, such as the boiling point of the organic solvent in which the resin is dissolved or dispersed, the distance between the spray gun to the surface of the photosensitive layer or the viscosity of the droplet at the time of arrival of the droplets at the surface of the photosensitive layer, are properly set.

In the invention, it is preferred that the resin to be stuck to the surface of the photosensitive layer is a resin alkali-soluble as well as soluble or dispersible in an organic solvent. In concrete, an acrylic copolymer mainly composed of methacrylic acid or acrylic acid, or an acrylic copolymer mainly composed of ammonium salt or methacrylic acid or that of acrylic acid are preferable.

In the invention, a copolymer composed of monomer units derived from monomers respectively selected from each of the following groups of (a), (b) and (c), is cited as the resin to be stuck to the surface of the photosensitive layer.

(a) At least one monomer selected from the group consisting of alkyl methacrylates having 1 to 10 carbon atoms in the alkyl residue thereof and alkyl methacrylates having 4 to 10 carbon atoms in the alkyl residue thereof.

In concrete, the group includes methyl acrylate, ethyl acrylate, n-propyl acrylate, iso-propyl acrylate, n-butyl acrylate, iso-butyl acrylate, n-amyl acrylate, iso-amyl acrylate, n-hexyl acrylate, 2-ethylhexyl acrylate, n-octyl acrylate, n-decyl acrylate, n-butyl methacrylate, iso-butyl methacrylate, n-amyl methacrylate, 2-ethylhexyl methacrylate, n-octyl methacrylate and n-decyl methacrylate.

(b) At least one monomer selected from the group consisting of styrenes, acrylonitriles, acrylamides, methyl methacrylate and ethyl methacrylate.

In concrete, the group includes styrene, o-, m- and p-methylstyrene, 2,4-dimethylstyrene, 2,5-dimethylstyrene, 3,4-dimethylstyrene, 3,5-dimethylstyrene, 2,4,5-trimethylstyrene, 2,4,6-trimethylstyrene, o-ethylstyrene, 3,5-diethylstyrene, 2,4,5-triethylstyrene, p-n-butylstyrene, m-sec-butylstyrene, m-tert-butylstyrene, p-hexylstyrene, p-n-heptylstyrene, p-2-ethylhexylstyrene, p-fluorostyrene, o-, m- and p-chlorostyrene, 2,3-dichlorostyrene, 2,4-dichlorostyrene, 2,5-dichlorostyrene, 2,6-dichlorostyrene, 3,4-dichlorostyrene, 2,5-difluorostyrene, p-bromostyrene, p-cyanostyrene, p-hydroxystyrene, m- and p-nitrostyrene, o-dimethylaminostyrene, acrylonitrile, α-chloroacrylonitrile, α-brommoacrylonitrile, methacrylonitrile, methyl methacrylate, ethyl methacrylate, acrylamide, N-sec-butylacrylamide, N-tert-butylacrylamide and N,N-dibutylacrylamide.

(c) At least one monomer selected from the group consisting of acrylic acid, methacrylic acid, maleic acid, itaconic acid and alkali metal salts and ammonium salts of these acids.

In concrete, acrylic acid, sodium acrylate, potassium acrylate, ammonium acrylate, methacrylic acid, sodium methacrylate, potassium methacrylate, ammonium methacrylate, maleic acid, sodium maleate, potassium maleate, ammonium maleate, itaconic acid, sodium itaconate, potassium itaconate and ammonium itaconate are cited.

The polymerized ratio of the monomers in the above-mentioned copolymer is preferably 10 to 70 weight-% of a monomer selected from (a), 20 to 80 weight-% of a monomer selected from (b) and 6 to 50 weight-% of a monomer selected from (c), particularly preferably 15 to 50 weight-% of a monomer selected from (a), 40 to 70 weight-% of a monomer selected from (b) and 10 to 25 weight-% of a monomer selected from (c).

When the resin is used in the form of dispersion in an organic solvent, a polyacrylate and its copolymer, a polyacrylonitrile and its copolymer, a polystyrene and its copolymer, a polyethylene and its copolymer, a polyvinyl chloride and its copolymer, a polyvinylidene chloride and its copolymer, a polyvinyl acetate and its copolymer, a resol resin and its copolymer, an ionomer resin, polymethacrylate of its copolymer, and polybutadiene and its copolymer are preferably usable.

The method to prepare the dispersion includes a method by which a resin separated from a latex prepared by emulsion polymerization method is dispersed in an organic solvent, and a method by which a resin is polymerized in an organic solvent capable of dissolving the monomer of the resin by not dissolving the polymer. The organic solvent to be used in the dispersion is preferably one capable of swelling the resin.

In the invention, an additive other than the resin may be contained in the resin to be stuck to the surface of the photosensitive layer. As the additive, a filler, for example, silicon dioxide, zinc oxide, titanium oxide, glass particles, alumina, or particles of polymer such as particles of polymethyl methacrylate, polystyrene or phenol resin, is usable.

In the invention, the spray-gun is a means for atomizing a liquid and attaining the atomized liquid to a surface to be coated by the droplets. The spray-gun includes an air spray, an airless spray, an electrostatic spray and an electrostatic atomizing spray.

As the method for atomizing a liquid in which the resin is dissolved or dispersed, an electrostatic atomizing method is preferred by which the liquid is dropped to a cup or a disk rotating at a high-speed of 10,000 to 100,000 rpm to form droplets, and the flying distance and the expansion of flow of the droplets are controlled by static electricity or air current.

In the invention, as the organic solvent for dissolving or dispersing the resin is preferably one having a boiling point within the range of from 75° C. to 250° C. The solvent having a boiling point of 75 to 250° C., for example, methanol, ethanol, isopropyl alcohol, butanol, ethyl acetate, acetone, methyl ethyl ketone and toluene are preferable usable.

The followings are also usable as the solvent other than the above-mentioned; carbon hydrides such as n-hexane, cyclohexane, heptane, octane, nonane and decane, diacetone alcohol, 3-methoxy-1-butanol, acetone, methyl ethyl ketone, cyclohexanone, ethylene glycol, diethylene glycol, ethylene glycol monoacetate, ethylene glycol alkyl ethers and acetate thereof such as methyl cellosolve, ethyl cellosolve, butyl cellosolve, ethylene glycol dimethyl ether, methyl cellosolve acetate and ethyl cellosolve acetate, diethylene glycol monoalkyl ethers and acetate thereof such as diethylene glycol monomethyl ether and diethylene glycol monomethyl ether acetate, diethylene glycol dialkyl ethers such as diethylene glycol dimethyl ether, diethylene glycol diethyl ether, diethylene glycol dibutyl ether and diethylene glycol methylethyl ether, triethylene glycol alkyl ethers such as triethylene glycol monomethyl ether, triethylene glycol monoethyl ether, triethylene glycol dimethyl ether, triethylene glycol diethyl ether and triethylene glycol methyl ethyl ether, propylene glycol alkyl ethers and acetate thereof such as propylene glycol monomethyl ether, propylene glycol monoethyl ether, propylene glycol n-propyl ether, propylene glycol monobutyl ether, propylene glycol dimethyl ether, diethyl ether, propylene glycol monomethyl ether acetate and propylene glycol monoethyl ether acetate, dipropylene glycol alkyl ethers such as dipropylene glycol monomethyl ether, monoethyl ether, dipropylene glycol n-propyl ether, dipropylene glycol monobutyl ether, dipropylene glycol dimethyl ether and dipropylene glycol diethyl ether, carboxylic acid esters such as ethyl oxalate, propyl oxalate, butyl oxalate, amyl oxalate, methyl acetate, ethyl acetate, propyl acetate, butyl acetate, methyl propionate, ethyl propionate, methyl butyrate and ethyl butyrate, dimethylformamide, dimethylsulfoxide, dioxane, tetrahydrofuran, methyl lactate, ethyl lactate, methyl benzoate, ethyl benzoate and propylene carbonate.

These solvents may be used solely or in combination of two or more kinds. The concentration of the resin in the solution or dispersion thereof is preferably 5 to 40% by weight, more preferably 10 to 40% by weight.

In the invention, the distance from the spray gun to the surface of the photosensitive layer is a distance from the pointed head of the spray gun to the surface of the photosensitive layer. The distance between the spray gun and the surface of the photosensitive layer is preferably 30 to 150 cm. When the distance is within the range of 30 to 150 cm, the droplets of the resin solution or dispersion are properly scattered on the surface to form dots of the resin.

In the invention, the viscosity of the liquid of the solution or dispersion of the resin at the time of arrival at the surface of the photosensitive layer after sprayed is preferably 2,000 cp to 8,000 cp, more preferably 3,000 cp to 7,000 cp, further preferably 4,000 cp to 6,000 cp. It is convenient for sticking the resin droplets in the form of dot that the viscosity is within the above-mentioned range.

To measure the viscosity, a liquid to be measured is sprayed from a spray-gun to a plate of Teflon arranged at the position away from the prescribed distance from the spray-gun and collected. The viscosity of the collected sample is measured at 25° C. by a B-type viscometer.

The viscosity of the resin solution or dispersion at the time of arrival at the surface of the photosensitive layer can be easily controlled by changing the concentration of the resin in the solution or dispersion of the resin or the kind of the solvent.

In the invention, the droplets of the resin solution or dispersion stuck on the surface of the photosensitive layer is dried preferably by a method using hot air and/or infrared rays. The drying by hot air is preferably carried out at a temperature of 30 to 200° C., more preferably 50 to 130° C., the drying time is optionally decided according to the drying temperature. The drying by infrared rays is preferably carried out so that the temperature at the surface of the photosensitive layer is 30 to 130° C., the drying time is optionally decided according to the power of the infrared heater.

EXAMPLES

Example 1

Preparation of Support

An aluminum plate having a thickness of 0.24 mm was degreased by a 5%-solution of sodium hydroxide and subjected to a electrolysis etching treatment under conditions of a temperature of 25° C., an electrolysis current density of 60 A/dm$^2$ and a time of 30 seconds in a 0.5 mol-solution of hydrochloric acid. Then the plate was subjected to a desmut treatment by a 5%-solution of sodium hydroxide and anodized in a sulfuric acid solution. The amount of the anodized layer was 20 mg/dm$^2$. The plate was subjected to a sealing treatment by immersing in hot water at 90° C.

A photosensitive liquid having the following composition was coated on a support to provide a photosensitive layer.

Composition Photosensitive Liquid

Novolak resin (phenol/m-cresol/p-cresol=10/54/36 in molar ratio, weight average molecular weight: 4,000) 7.5 parts by weight Condensation product of pyrogallol-acetone resin (weight average molecular weight: 3,000) and o-naphthoquinone-diazide-5-sulfonyl chloride (esterized ratio: 30%) 2.5 parts by weight Victoria Pure Blue BOH (Hodogaya Kagaku Co., Ltd.) 0.08 parts by weight 2,4-bis(trichloromethyl)-6-(p-methoxystyryl)-s-triazine 0.10 parts by weight Mixture of Methyl ethyl ketone and propylene glycol monomethyl ether in a volume ratio of 40/60% 100 parts by weight Sample 1 was prepared by spraying the resin solution shown in Table 1 on the surface of the above-obtained photosensitive layer by means of an electrostatic atomizing spray gun Super Micro Bell, manufactured by Ransburg Inductrial Finishing Co., Ltd., having a bell of diameter of 30 mm. The solid content of the resin solution was 20% by weight and the distance from the spray gun to the surface of the photosensitive layer was as shown in Table 1. Then the coated surface was dried by hot air for 5 seconds at 60° C.

Furthermore, Samples 2 to 9 and Comparative Sample 1 were each prepared in the same manner as in Sample 1 except that the composition of the resin solution and the distance from the spray gun to the surface of the photosensitive layer were changed as shown in Table 1.

TABLE 1

|  | Resin | Solvent | Distance from the spray gun to the surface of the photosensitive layer (cm) |
| --- | --- | --- | --- |
| Sample 1 | Novolak resin | Diethylene glycol dimethyl ether | 60 |
| Sample 2 | Novolak resin | Ethyl alcohol | 60 |
| Sample 3 | Novolak resin | Methyl alcohol | 60 |
| Sample 4 | Novolak resin | Diethylene glycol dimethyl ether | 30 |
| Sample 5 | Novolak resin | Diethylene glycol dimethyl ether | 100 |
| Sample 6 | Novolak resin | Diethylene glycol dimethyl ether | 150 |
| Sample 7 | Novolak resin | Diethylene glycol dimethyl ether | 20 |
| Sample 8 | Novolak resin | Diethylene glycol dimethyl ether | 200 |
| Sample 9 | Acryl resin 1 | Diethylene glycol dimethyl ether | 60 |
| Comparative Sample 1 | Acryl resin 2 | Water | 60 |

The resins in the above table were as follows:

Novolak resin: Molar ratio of phenol/m-cresol/p-cresol of 5/57/38, weight average molecular weight of 4,000

Acryl resin 1: Weight ratio of methyl acrylate/ethyl acrylate/acrylic acid of 68/20/12, weight average molecular weight of 15,000

Acryl resin 2: Weight ratio of methyl acrylate/ethyl acrylate/sodium acrylate of 68/20/12, weight average molecular weight of 15,000

The adhessiveness of the matting resin with the surface of the photosensitive layer and the vacuum-contacting ability of thus obtained presensitized printing plates under a high humid condition were measured. The measuring results are listed in Table 2 together with the appearance of the matting resin.

Evaluation of the adhessiveness of the resin with the surface of the photosensitive layer:

A blade of brass having a width of 15 mm and a thickness of 1.5 mm was vertically contacted to the matted surface of the sample of the presensitized printing plate and slid on the surface while loading weight. The loading weight was changed and the adhessiveness was evaluated by the loading weight necessary to completely peel off the matting resin from the surface of the sample.

Evaluation of the vacuum-contacting ability:

A time necessary for completely contacting a film having a size of 900 mm×600 mm with the sample of the presensitized printing plate having a size of 1003 mm×800 mm in a vacuum printer was measured. The sample was stand before the measurement for 12 hours in a room conditioned at a humidity of 70% and a temperature of 25° C.

TABLE 2

| | Diameter of resin particle ($\mu$m) | Height of resin particle ($\mu$m) | Number of resin particle per mm$^2$ | Adhesiveness (g) | Vacuum-contacting ability (Second) |
|---|---|---|---|---|---|
| Sample 1 | 10–40 | 4–5 | 100–150 | 400 | 30 |
| Sample 2 | 15–30 | 4–6 | 70–120 | 300 | 40 |
| Sample 3 | 20–30 | 4–6 | 50–90 | 150 | 50 |
| Sample 4 | 20–50 | 2–4 | 120–160 | 450 | 30 |
| Sample 5 | 10–30 | 4–6 | 80–120 | 300 | 40 |
| Sample 6 | 20–30 | 4–6 | 70–100 | 200 | 45 |
| Sample 7 | 20–60 | 2–3 | 150–200 | 500 | 50 |
| Sample 8 | 20–30 | 4–6 | 50–90 | 150 | 50 |
| Sample 9 | 10–40 | 4–5 | 100–150 | 400 | 30 |
| Comparative Sample 1 | 10–40 | 4–5 | 100–150 | 100 | 70 |

Example 2

Sample 10 and Comparative sample 2 were prepared in the same manner as in Sample 1 in Example 1 except that the resin solution was replaced by the dispersions shown in Table 3 in which the resin the same as that disclosed in JO O.P.I. 5-249675 was dispersed in a form of particles having a diameter of 0.03 $\mu$m to 0.07 $\mu$m.

TABLE 3

| Sample No. | Resin | Dispersing medium | Distance from the spray gun to the surface of the photosensitive layer (cm) |
|---|---|---|---|
| Sample 10 | Trimethylolpropane polyacrylate resin* | Ethylene glycol monomethyl ether | 60 |
| Comparative Sample 2 | ditto | Water | 60 |

*Resin described in Example 1 of JP O.P.I. 5-249675

The samples were evaluated in the same manner as in Example 1. Results are listed in Table 4.

TABLE 4

| | Diameter of resin particle ($\mu$m) | Height of resin particle ($\mu$m) | Number of resin particle per mm$^2$ | Adhesiveness (g) | Vacuum-contacting ability (Second) |
|---|---|---|---|---|---|
| Sample 10 | 10–40 | 4–5 | 100–150 | 200 | 30 |
| Comparative Sample 2 | 10–40 | 4–5 | 100–150 | 100 | 35 |

Example 3

Samples 11 to 17 were prepared in the same manner as in Sample 1 of Example 1 except that the resin solutions shown in Table 5 were used in place of the resin solution in Sample 1. The novolak resin used in the samples was the same as that used in Example 1, and the distance from the spray gun to the surface of the photosensitive layer was 60 cm for all the samples.

TABLE 5

| | Resin | | Solvent | |
|---|---|---|---|---|
| Sample No. | Kind | Amount (Parts by weight) | Kind | Amount (Parts by weight) |
| Sample 11 | Novolak | 13 | Diethylene glycol dimethyl ether | 87 |
| Sample 12 | Ditto | 17 | Ditto | 83 |
| Sample 13 | Ditto | 20 | Ditto | 80 |
| Sample 14 | Ditto | 23 | Ditto | 77 |
| Sample 15 | Ditto | 28 | Ditto | 72 |
| Sample 16 | Ditto | 5 | Ditto | 95 |
| Sample 17 | Ditto | 32 | Ditto | 68 |

The viscosity of the resin solution at the time of arrival at the surface of the photosensitive layer was measured furthermore the measurements of the adhesiveness of the resin particles to the surface of the photosensitive layer and the vacuum-contacting ability. Results of the measurements are listed in Table 6.

TABLE 6

| Sample No. | Viscosity of the solution at the time of arrival at the photosensitive layer surface (cp) | Adhessiveness of the resin particles to the photosensitive layer surface (g) | Vacuum-contacting ability (Second) |
|---|---|---|---|
| Sample 11 | 2000 | 500 | 45 |
| Sample 12 | 3000 | 450 | 40 |
| Sample 13 | 4000 | 400 | 30 |
| Sample 14 | 6000 | 300 | 30 |
| Sample 15 | 8000 | 200 | 30 |
| Sample 16 | 1000 | 650 | 60 |
| Sample 17 | 9000 | 150 | 35 |

What is claimed is:

1. A method for producing a presensitized printing plate comprising the steps of:
   providing a photosensitive layer on a support;
   spraying a resin dissolved or dispersed in an organic solvent on the surface of the photosensitive layer so that sprayed droplets of the resin solution or dispersion are stuck onto the surface of the photosensitive layer to form dots of the resin; and drying the droplets stuck on the surface of the photosensitive layer so that the surface of the photosensitive layer is dotted with the particles of the resin;

wherein the droplet of the solution or dispersion of the resin has a viscosity of 2,000 cp to 8,000 cp at the time of arriving at the surface of the photosensitive layer.

2. The method of claim 1, wherein said organic solvent has a boiling point of 75° C. to 250° C., and the distance from a spray-gun for spraying the resin dissolved or dispersed in the organic solvent, to said surface of the photosensitive layer is within the range of 30 cm to 150 cm.

3. The method of claim 2, wherein the distance from said spray-gun to said surface of the photosensitive layer is within the range of 30 cm to 100 cm.

4. The method of claim 1, wherein the droplet of the solution or dispersion of the resin has a viscosity of 3,000 cp to 7,000 cp at the time of arriving at the surface of the photosensitive layer.

5. The method of claim 4, wherein the droplet of the solution or dispersion of the resin has a viscosity of 4,000 cp to 6,000 cp at the time of arriving at the surface of the photosensitive layer.

6. The method of claim 5, wherein the droplets stuck on the surface of the photosensitive layer are dried by hot air or infrared rays.

7. The method of claim 1, wherein said droplets are dried by hot air or infrared rays.

* * * * *